ized*

United States Patent
Dudeck et al.

(10) Patent No.: US 7,755,948 B2
(45) Date of Patent: Jul. 13, 2010

(54) PROCESS AND TEMPERATURE TOLERANT NON-VOLATILE MEMORY

(75) Inventors: Dennis Dudeck, Hazelton, PA (US); Donald Evans, Lancaster, OH (US); Hai Pham, Hatfield, PA (US); Wayne Werner, Coopersburg, PA (US); Ronald Wozniak, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 91 days.

(21) Appl. No.: 12/194,028

(22) Filed: Aug. 19, 2008

(65) Prior Publication Data

US 2010/0046291 A1    Feb. 25, 2010

(51) Int. Cl.
*G11C 16/06*    (2006.01)

(52) U.S. Cl. .................. 365/185.25; 365/203
(58) Field of Classification Search ............ 365/185.25, 365/203
See application file for complete search history.

(56) References Cited

U.S. PATENT DOCUMENTS

2007/0091703 A1*    4/2007    Nishimura et al. .......... 365/212

* cited by examiner

*Primary Examiner*—Hoai V Ho
*Assistant Examiner*—Jason Lappas

(57) ABSTRACT

A nonvolatile memory comprising an array of memory cells and sense amplifiers, each sense amplifier using a keeper circuit to provide an amount of current to compensate for bit line leakage current in the memory array. The amount of current from the keeper depends on the temperature of the memory and the speed of the process used to make the memory.

17 Claims, 3 Drawing Sheets

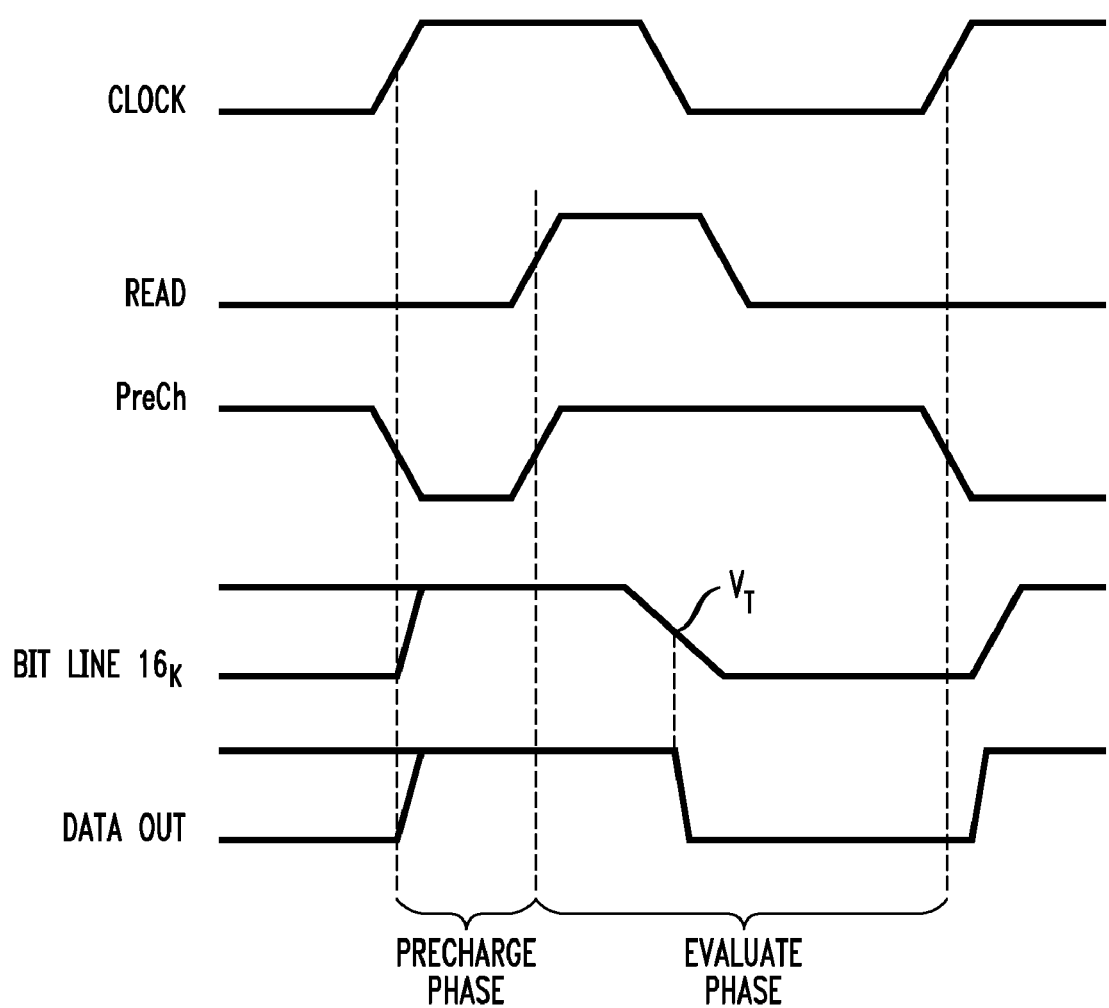

PROCESS AND TEMPERATURE TOLERANT NON-VOLATILE MEMORY

TECHNICAL FIELD

The present invention relates to integrated circuit memories generally, and, in particular, to integrated circuit nonvolatile memories.

BACKGROUND

Nonvolatile memories are widely used in various electronic systems, such as computer systems. There are various kinds of nonvolatile memories, such as read-only, programmable read-only, or floating-gate memories. A memory cell in a typical read-only memory (ROM) has an access transistor that is "programmed" during manufacture to be operable or inoperable in accordance with the desired data. A typical programmable read-only memory (PROM) cell has an access transistor and a polysilicon or metal fuse that is programmed by a user after manufacture but is programmable only once. A memory cell in a floating-gate memory, such as an electrically erasable read-only-memory (EEPROM), has a transistor with a programmable threshold voltage that allows a user to program the cell multiple times.

Generally and for purposes here, an unprogrammed memory cell stores a "0" and a programmed memory cell stores a logic "1." For example, if the memory cell in a PROM is programmed, the fuse is "blown," making the programmed memory cell nonconductive. Otherwise, the memory cell is conductive when enabled for reading the contents thereof.

Nonvolatile memories are generally arranged in an M word (M rows) by N bits per word (N columns) configuration, where N bits are typically read at a time (i.e., in parallel) from the memory. Each row of N memory cells is coupled to a corresponding one of M word lines, and each column of M memory cells is coupled to a corresponding one of N bit lines. During a read of the memory, an address decoder or the like coupled to the word lines enables one row of N memory cells and the contents of an enabled row of memory cells are sensed by N sense amplifier coupled to the N columns to produce an N-bit binary output from the memory. The sense amplifiers used in most nonvolatile applications are non-differential, e.g., each sense amplifier has a single input coupled to a corresponding bit line and a single output.

During a typical read cycle, each bit line is pre-charged to a fixed voltage (typically the voltage of the power supply for the memory), here a logic "1." Then, an enabled memory cell storing a "0" at least partially discharges the corresponding bit line, while the memory cell storing a "1" does not significantly affect the bit line voltage. The resulting voltage level of the bit line is sensed by a sense amplifier, typically a simple CMOS inverter. The time it takes the voltage on the bit line to reach the switch point of the inverter defines the bit line access time and the number of memory cells and other circuit elements connected to a bit line influences the time it takes for a single memory cell to discharge the bit line. However, due to the leakage currents by the many memory cells connected to each of the bit lines, the bit line voltage may drift downward during a read, potentially causing a "0" to be read instead of a "1."

To compensate for the leakage currents, anti-leakage "keeper" circuits are coupled to the bit lines to keep the bit lines near the pre-charge voltage during the read cycle. Due to manufacturing process variations and operating temperature conditions, the keeper circuits may be too strong relative to the capability of the memory cells or too weak to overcome the leakage currents: too strong a keeper might excessively extend the time required by a memory cell to discharge a bit line, causing a timing delay fault or even causing an incorrect output logic state fault; too weak a keeper could also cause an incorrect output logic state fault. These faults are most evident at process and temperature extremes. For example, operating at a high temperature a memory manufactured with a "slow" process (i.e., the transistors are "weak" relative to transistors made using a nominal process), the memory cell leakage currents might be so excessive so that one or more of the keeper circuits will not be sufficiently strong to keep the memory cell leakage current from pulling the bit line voltage too low during a read, resulting in "0" being read instead of a "1." Conversely, when the temperature is low and the process "fast" (i.e., the transistors in the memory are "strong" relative to transistors made in a nominal process), the keeper circuits might be so strong that a memory cell storing a "0" will be unable to pull the bit line voltage low enough, resulting in a "1" being read instead of a "0." Thus, there may only be a narrow temperature range and processing speed range for which the memory is operable. Moreover, since the leakage currents increases as the sizes of the transistors decrease and the total leakage current for each bit line is further aggravated as the number of memory cells coupled to each bit line increases, large memory designs implemented using very small geometries might not be practical to implement.

SUMMARY

In one embodiment, the present invention is a memory having at least one array of memory cells arranged in rows and columns, and a plurality of sense amplifiers having inputs coupled to corresponding columns of the memory cells. The at least one of the sense amplifiers has a keeper circuit therein adapted to provide an amount of current to the input of the sense amplifier depending on at least one of a temperature of the memory array and a process speed of the memory array.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements.

FIG. 3 is a simplified timing diagram for the memory of FIG. 1 and the sense amplifier of FIG. 2.

DETAILED DESCRIPTION

Figure 1:
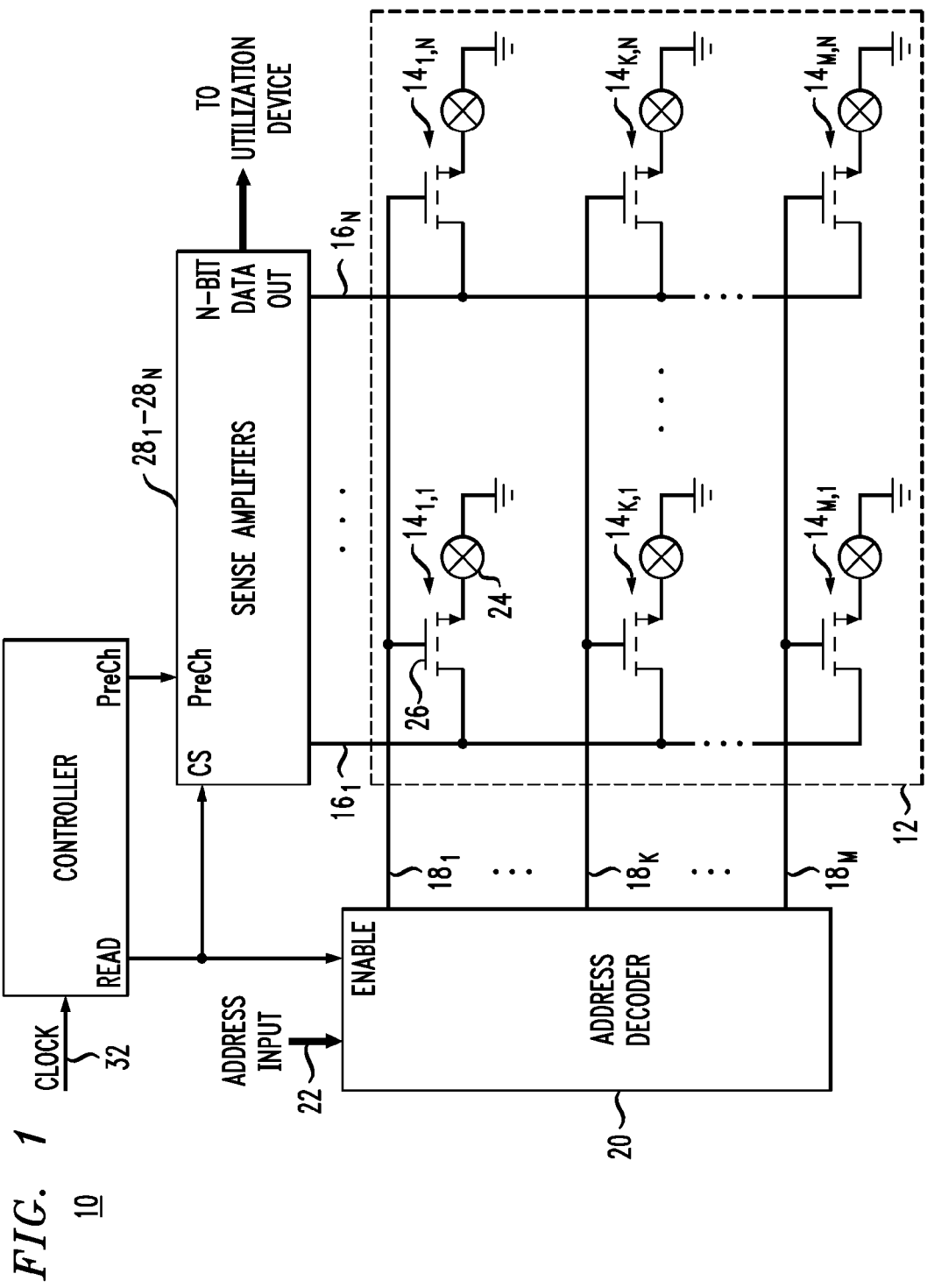
FIG. 1 is a simplified block diagram of an exemplary nonvolatile memory according to one embodiment of the invention.

Referring to FIG. 1, a simplified block diagram of an exemplary nonvolatile memory 10 for use in an application specific integrated circuit (ASIC), or the like, is shown in accordance with an exemplary embodiment of the invention. The memory 10 comprises an array of memory cells 12 arranged into N columns of memory cells and M rows of memory cells. Data is read from a selected columns of memory cells $14_{K,1}$-$14_{K,N}$ ($1 \leq K \leq M$) onto corresponding bit lines $16_1$-$16_N$ when the memory cells $14_{K,1}$-$14_{K,N}$ are enabled for a read operation in response to an enabled one (e.g., $18_K$) of the read select lines $18_1$-$18_M$. A conventional read address decoder 20 enables one of the lines $18_1$-$18_M$ in response to a read address input signal 22 and an enable signal from controller 30, discussed below. In this exemplary embodiment, the memory 10 is a PROM with each memory cell thereof having a storage element and an access transistor. For the exemplary memory cell $14_{1,1}$, the storage element 24 is a fuse that is programmed conventionally to store a data value and, when a cell is enabled for a read operation (i.e., when the stored data value is to be read from the enabled cell), the access transistor 26 in the cell couples the storage element 24 to the corresponding bit line $16_1$. It is understood that the memory cells may be of an alternative design, such as using an anti-fuse for element 24 or have a merged storage element and access transistor (e.g., a floating-gate memory cell).

Data read from enabled ones of the memory cells $14_{1,1}$-$14_{M,N}$ are amplified and "evaluated" by sense amplifiers $28_1$-$28_N$ to produce an N-bit data output. As will be described in more detail in connection with FIG. 2, the sense amplifiers $28_1$-$28_N$ precharge corresponding bit lines $16_1$-$16_N$ prior to receiving the data stored in enabled memory cells $14_{K,1}$-$14_{K,N}$. (For this example, the enabled memory cells storing a "0" discharge the corresponding precharged bit line $16_1$-$16_N$, and those cells storing a "1" have no substantial effect on the corresponding precharged bit lines; as described above, in a typical memory 10, an unprogrammed cell stores a "0" while a programmed one stores a "1."). After a time sufficient for any unprogrammed and enabled memory cells to discharge the corresponding bit lines, the sense amplifiers $28_1$-$28_N$ evaluate the bit line voltages to determine if the enabled memory cells contained a "1" or a "0" and provide the results to the N-bit data output.

Controlling the operation of the memory 10 is a conventional controller 30. In this example, the memory 10 is known as a clocked or synchronous memory wherein the operation and timing of the address decoder 20 and sense amplifiers $28_1$-$28_N$ occurs is in response to a clock signal 32. In this embodiment and as will be described in more detail in connection with FIG. 3, the clock signal 32 initiates the precharging of the bit lines by a precharge portion of the sense amplifiers $28_1$-$28_N$ during a precharge phase and the subsequent enabling of the address decoder 20 and amplifier portion of the sense amplifiers $28_1$-$28_N$ during an evaluation phase.

Figure 2:
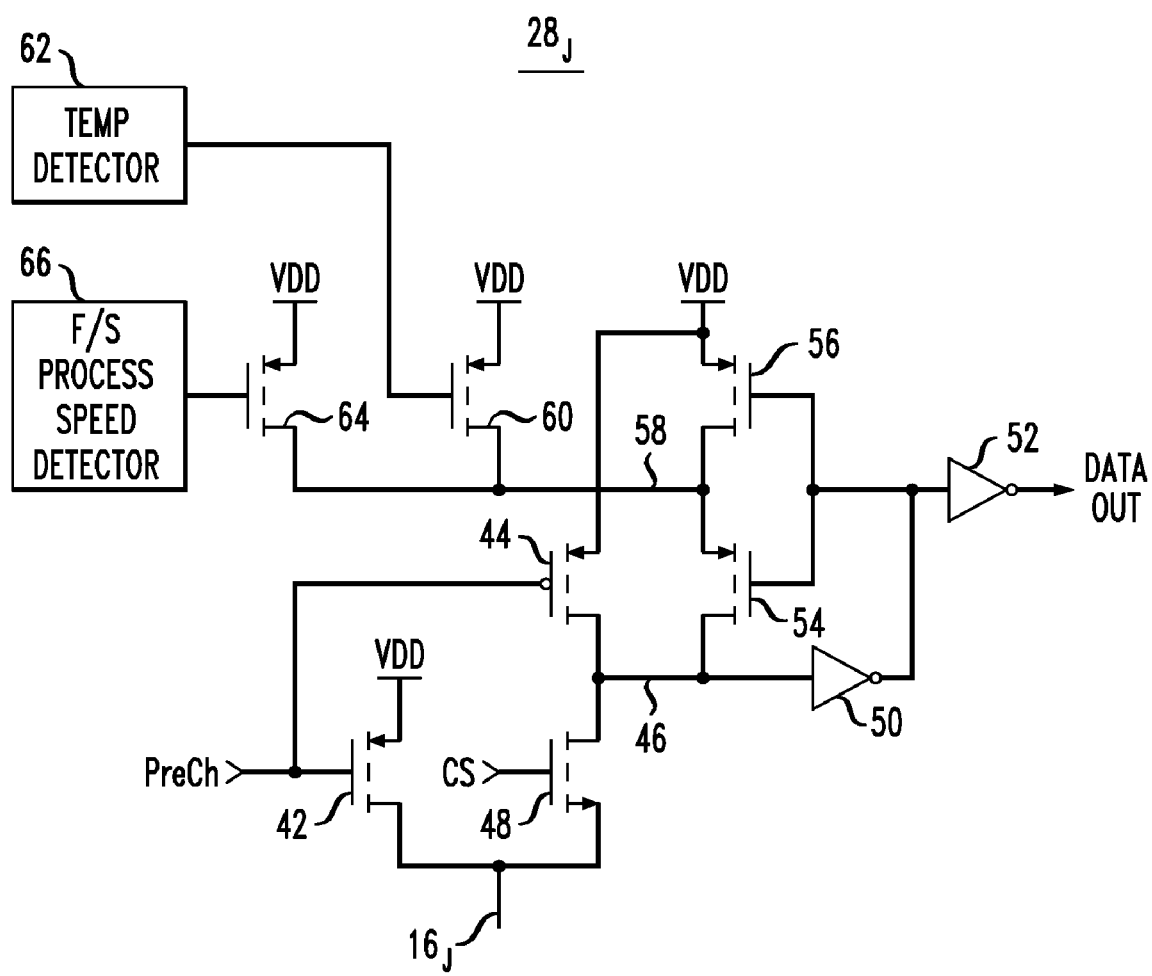
FIG. 2 is a simplified schematic diagram of an exemplary sense amplifier for the memory of FIG. 1, according to another embodiment of the invention.

Shown in FIG. 2 is a simplified schematic diagram of an exemplary sense amplifier $28_J$ ($1 \leq J \leq N$) according to one embodiment of the invention. The amplifier $28_J$ is in this example one of the sense amplifiers $28_1$-$28_N$ of FIG. 1. Simply put, the precharge portion of the sense amplifier $28_J$ first precharges bit line $16_J$ in response to precharge signal PreCh, and then the amplifier portion amplifies and evaluates signals on the bit line in response to control signal CS. Specifically, asserting precharge control signal PreCh enables p-channel transistor 42 to couple the bit line $16_J$ to VDD to precharge the bit line $16_J$. Asserting precharge control signal PreCh also enables p-channel transistor 44 to precharge node 46 such that when n-channel transistor 48 is enabled by control signal CS (for purposes here, signals PreCh and CS do not overlap, i.e., are not asserted simultaneously), the voltage on node 46 will be approximately the same as the voltage on the bit line $16_J$.

After an amount of time to assure that the bit line $16_J$ (and node 46) is fully precharged, controller 30 (FIG. 1) releases (deasserts) PreCh and asserts CS, thereby enabling n-channel transistor 48 and enabling the address decoder 20 (FIG. 1), as described in more detail in connection with FIG. 3. As an enabled memory cell (as described above in connection with FIG. 1) discharges the bit line $16_J$ and, concomitantly, node 46, the output of amplifier 50 (in this example, an inverting amplifier such as a CMOS inverter) goes low once the voltage on node 46 drops below the threshold voltage $V_T$ of the amplifier 50, signifying that the data stored in the enabled memory cell (not shown) is a "0." Conversely, if the voltage on the node 46 does not drop below $V_T$, then the data stored in the enabled memory cell is a "1." Typically, $V_T$ is about VDD/2 volts but may be another fraction of VDD (as determined, for example, by the relative sizes of the transistors in amplifier 50), or set to fixed voltage (by using a conventional comparator in place of the amplifier), as needed. Optional inverter 52 inverts the output of amplifier 50 to provide a non-inverted data output. It is understood that the amplifier 50 may be any inverting CMOS gate, such as an inverter, a NAND gate, or a NOR gate, as may be required.

As discussed above, due to leakage currents by memory cells $14_{1,J}$-$14_{M,J}$ (not shown) coupled to the bit line $16_J$, the voltages of the bit line $16_J$ and node 46 may drift lower after the precharge thereof, potentially causing a "0" to be read when the enabled memory cell is programmed with a "1." To counter the voltage drift due to leakage, a "keeper" circuit of series-coupled p-channel transistors 54 and 56 (via node 58) provide a small amount of current to node 46 and to the bit line $16_J$ while transistor 48 is enabled. The keeper provides current while the output of the amplifier 50 is low, i.e., while the voltage of node 46 is above $V_T$. Switching the keeper on and off saves power and increases noise margins while the bit line is low.

Disadvantageously, the keeper could provide so much current that the enabled memory cell coupled to the bit line $16_J$ might not be able to discharge the bit line sufficiently to switch amplifier 50 within a certain amount of time. This condition is likely to occur when the process is slow and the temperature of the memory is low.

To improve the performance of the sense amplifier $28_J$ at low temperatures or when the memory 10 is fabricated using a "fast" process, the keeper is modified to selectively provide additional current to node 58, i.e., current in addition to current passed through transistor 56. One additional source of current to node 58 is supplied by p-channel transistor 60 when the temperature of the memory 10 (FIG. 1) is greater than a certain amount, e.g., 85° C., as measured by a conventional temperature detector 62 having a temperature sensor fabricated near or on the same substrate as the memory array 12 (one example of a temperature detector is an NE 1617 temperature monitor manufactured by NXP Semiconductors of Eindhoven, The Netherlands). Similarly, an additional source of current is supplied to node 58 by p-channel transistor 60 when the process used to fabricate the memory 10 is considered fast as determined by a conventional Fast/Slow (F/S) Process Speed Detector 66, typically fabricated on the same substrate as the memory array 12, which determines whether the "speed" of the process used to make the memory is fast or slow. One exemplary process speed detector 66 is disclosed in U.S. Pat. No. 6,259,311, incorporated herein by reference in its entirety and assigned to the same assignee as this invention, although other conventional process speed detectors (e.g., threshold voltage testing or ring oscillator oscillation frequency measurement) may be used as well. Typically, the temperature detector 62 and the process detector 66 are shared between all the sense amplifiers $28_1$-$28_N$ (FIG. 1).

Advantageously, by adjusting the leakage current compensating current supplied by the keepers to the bit lines depending on temperature and processing, the memory 10 is operable over a wider temperature range and processing variation than a fixed current keeper implementation. This may increase the number of operable memories from a wafer (known as yield), particularly as the feature size of the process used to make the memory decreases (e.g., from 65 nm to 45 nm and smaller). It is understood, however, it may not be necessary to use both the temperature compensation and the process speed compensation techniques in the keepers.

It is understood that in this embodiment transistor 56 is optional if the leakage current by the memory array 12 (FIG. 1) is sufficiently low that the memory 10 works satisfactorily when both transistors 60 and 64 are non-conductive, i.e., the keeper is disabled. Further, the transistors 56, 60, and 64 may each supply the same amount of current (by making the transistors 56, 60, and 64 approximately the same size) but it is understood that each transistor may be sized to provide a desired amount of current depending on the needs of the design. Still further, the temperature detector 62 may be located remote from the memory 10, such as on a separate chip. Having a separate temperature detector chip advantageously allows the separate chip to control multiple memory chips.

In an alternative arrangement, control signals from either or both of the temperature detector 62 and process detector 66 may come from a register loaded under the control of a processor or the like (not shown). Further, process detector 66 may be replaced with a conventional programmable element (e.g., a fuse) programmed during testing of the memory 10 when, for example, the memory 10 is first tested for functionality while additionally tested to determine the speed of the process used to make the memory, as discussed above.

If more than one memory array 12 is to be used with the sense amplifier $28_1$-$28_N$, then transistors 42 and 48 are replicated in each sense amplifier $28_1$-$28_N$ for each additional memory array, each array having its own set of bit lines. In this case, as is well known and for each memory array, each additional transistor 48 may be controlled by the address decoder 20 (FIG. 1) or an additional decoder (not shown), to provide the needed address decoding to select which memory array is to be read. Similarly, transistor 42 and each additional transistor 42 are controlled as described above for the single memory array implementation.

FIG. 3 illustrates the exemplary operation of the memory 10 of FIG. 1 and the sense amplifier $28_J$ of FIG. 2. In response to the rising edge of the clock signal, the controller 30 asserts the PreCh signal (in this example, PreCh is an active low signal) to the sense amplifiers $28_1$-$28_N$ for them to precharge the bit lines $16_1$-$16_N$ as discussed above in connection with FIG. 2. As shown, the voltage on bit line $16_J$ is held at or near VDD during the precharge phase, i.e., while the PreCh signal is being asserted.

Upon release of the PreCh signal, the Read signal is asserted by the controller 30, thereby enabling the address decoder 20 (via input ENABLE) and the sense amplifiers $28_1$-$28_N$ (via input CS) to access and evaluate the data stored in the array 12. As illustrated herein, an enabled, unprogrammed memory cell (storing a "0") coupled to bit line $16_J$ begins to discharge the bit line. Once the bit line voltage reaches $V_t$, the amplifier 50 switches state and the output of the sense amplifier $28_J$ goes low. When the clock again transitions high, the above process begins again starting with the precharge phase.

It is understood that while the embodiment shown herein is a memory for an ASIC, the invention may be used in any application where nonvolatile high-speed memories are desired, e.g., in microprocessors, FPGAs, etc.

For purposes of this description and unless explicitly stated otherwise, each numerical value and range should be interpreted as being approximate as if the word "about" or "approximately" preceded the value of the value or range. Further, signals and corresponding nodes, ports, inputs, or outputs may be referred to by the same name and are interchangeable. Additionally, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the terms "implementation" and "example."

Also for purposes of this description, the terms "couple," "coupling," "coupled," "connect," "connecting," or "connected," refer to any manner known in the art or later developed in which a signal is allowed to be transferred between two or more elements and the interposition of one or more additional elements is contemplated, although not required. Conversely, the terms "directly coupled," "directly connected," etc., imply the absence of such additional elements.

It is understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A memory comprising:
   an array of memory cells arranged in N columns of memory cells and M rows of memory cells;
   M select lines coupling to corresponding rows of memory cells;
   N bit lines coupling to corresponding columns of memory cells, wherein M and N are positive integers;
   an address decoder adapted to enable a selected one of the M select lines in response to an address; and
   N sense amplifiers coupled to corresponding ones of the bit lines;
   wherein at least one of the sense amplifier comprises:
   a first precharge transistor adapted to couple the corresponding one of the bit lines to a power supply node in response to a first signal;
   an amplifier, having an output and an input, the input coupling to the corresponding bit line;
   a first transistor, responsive to the output of the amplifier, adapted to couple the input of the amplifier to an intermediate node; and
   a second transistor adapted to selectively couple the intermediate node to the power supply node in response to a signal dependent on one of process speed of the memory or temperature of the memory.

2. The memory of claim 1, further comprising:
   a first coupling transistor adapted to couple the corresponding bit line to the input of the amplifier in response to a second signal.

3. The memory of claim 2, further comprising:
a timing circuit, responsive to a clock signal, adapted to generate the first and second signals, the first and second signals being non-overlapping signals.

4. The memory of claim 1, further comprising:
an additional array of memory cells arranged in columns and rows, the columns of memory cells coupling to corresponding additional bit lines;
wherein the at least one sense amplifier further comprises:
a first coupling transistor, responsive to the address decoder, adapted to couple the corresponding bit line of the memory cells to the input of the amplifier;
a second coupling transistor, responsive to the address decoder, adapted to couple a corresponding one of the additional bit lines to the input of the amplifier; and
a second precharge transistor adapted to couple a corresponding one of the additional bit lines to the power supply node in response to the first signal;
wherein the address decoder, in response to the second signal, is further adapted to enable one of the first or second coupling transistors.

5. The memory of claim 1, wherein at least one memory cell comprises an access transistor and a fuse.

6. The memory of claim 1, wherein at least one memory cell comprises a floating-gate transistor.

7. The memory of claim 1, further comprising:
an additional transistor, responsive to the output of the amplifier, adapted to couple the intermediate node to the power supply node.

8. The memory of claim 1, further comprising:
a temperature sensor adapted to generate the signal dependent on memory temperature.

9. The memory of claim 8, wherein the temperature sensor and the memory array are formed in different substrates.

10. The memory of claim 1, further comprising:
a process speed detector adapted to generate the signal dependent on process speed of the memory.

11. The memory of claim 1, further comprising:
a storage element;
wherein the storage element is adapted to store a value related to process speed of the memory and provide the signal dependent on process speed of the memory.

12. The memory of claim 1, wherein the amplifier is an inverting CMOS gate.

13. The memory of claim 1, further comprising:
an additional precharge transistor adapted to couple the input of the amplifier to the power supply node in response to the first signal.

14. The memory of claim 1, wherein the address decoder is additionally response to the first signal and the address decoder enables a selected one of the M select lines in response to the first signal and the address.

15. A memory comprising:
an array of memory cells arranged in N columns of memory cells and M rows of memory cells;
M select lines coupling to corresponding rows of memory cells;
N bit lines coupling to corresponding columns of memory cells, wherein M and N are positive integers;
an address decoder adapted to enable a selected one of the M select lines in response to an address;
N sense amplifiers coupled to corresponding ones of the bit lines;
a temperature sensor adapted to generate a signal related to temperature of the memory; and
a process speed detector adapted to generate a signal related to process speed of the memory;
wherein at least one of the sense amplifier comprises:
a precharge transistor adapted to couple the corresponding one of the bit lines to a power supply node in response to a first signal;
an amplifier, having an output and an input, the input coupling to the corresponding bit line;
a first transistor, responsive to the output of the amplifier, adapted to couple the input of the amplifier to an intermediate node;
a second transistor adapted to selectively couple the intermediate node to the power supply node in response to the signal related to temperature of the memory; and
a third transistor adapted to selectively couple the intermediate node to the power supply node in response to the signal related to process speed of the memory.

16. The memory of claim 15, further comprising:
a coupling transistor adapted to couple the corresponding bit line to the input of the amplifier in response to a second signal.

17. The memory of claim 16, further comprising:
a timing circuit, responsive to a clock signal, adapted to generate the first and second signals, the first and second signals being non-overlapping signals.

* * * * *